(12) United States Patent
Parikh et al.

(10) Patent No.: US 11,114,020 B2
(45) Date of Patent: Sep. 7, 2021

(54) MICRO LED DISPLAY MINIATURIZATION MECHANISM

(71) Applicant: Intel Corporation, Santa Clara, CA (US)

(72) Inventors: Kunjal Parikh, San Jose, CA (US); Dong Yeung Kwak, San Jose, CA (US); Prakash Radhakrishnan, Portland, OR (US); Peter Chang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/329,529

(22) PCT Filed: Oct. 1, 2016

(86) PCT No.: PCT/US2016/055069
§ 371 (c)(1),
(2) Date: Feb. 28, 2019

(87) PCT Pub. No.: WO2018/063411
PCT Pub. Date: Apr. 5, 2018

(65) Prior Publication Data
US 2019/0221155 A1    Jul. 18, 2019

(51) Int. Cl.
*G09G 3/20* (2006.01)
*G09G 3/32* (2016.01)
*H01L 27/32* (2006.01)
*G09G 3/00* (2006.01)

(52) U.S. Cl.
CPC ............ *G09G 3/2096* (2013.01); *G09G 3/00* (2013.01); *G09G 3/32* (2013.01); *H01L 27/3255* (2013.01); *G09G 2310/0297* (2013.01)

(58) Field of Classification Search
CPC ............ G09G 2310/0297; G09G 3/00; G09G 3/2096; G09G 3/32; H01L 27/3255
See application file for complete search history.

(56) References Cited

U.S. PATENT DOCUMENTS

| | | | |
|---|---|---|---|
| 2007/0126970 A1* | 6/2007 | Shie .................... | G02F 1/13452 349/149 |
| 2009/0027369 A1* | 1/2009 | Lee ......................... | G09G 3/20 345/204 |
| 2009/0295772 A1* | 12/2009 | Kim .................... | G09G 3/2022 345/211 |

(Continued)

FOREIGN PATENT DOCUMENTS

EP            3037932            6/2016

OTHER PUBLICATIONS

International Preliminary Report on Patentability for International Patent Application No. PCT/US2016/050069, dated Apr. 11, 2019, 13 pgs.

(Continued)

*Primary Examiner* — Hong Zhou
(74) *Attorney, Agent, or Firm* — Schwabe, Williamson & Wyatt, P.C.

(57) ABSTRACT

A mobile computing device comprising a Light Emitting Diode (LED) display; including a display panel and a substrate, and two or more controller integrated circuits mounted (ICs) mounted on the substrate to directly drive a serial interface into the display panel.

18 Claims, 4 Drawing Sheets

(56) References Cited

U.S. PATENT DOCUMENTS

| | | |
|---|---|---|
| 2011/0310296 A1 | 12/2011 | Lee et al. |
| 2015/0169011 A1* | 6/2015 | Bibl .................... H01L 23/3171 |
| | | 345/175 |
| 2015/0309649 A1* | 10/2015 | Lee ....................... G06F 3/0416 |
| | | 345/173 |
| 2015/0371585 A1* | 12/2015 | Bower .................. H01L 33/385 |
| | | 345/1.1 |
| 2016/0180821 A1* | 6/2016 | Chang .................. G09G 3/3413 |
| | | 345/531 |
| 2016/0190117 A1* | 6/2016 | Liu ........................ H05K 1/025 |
| | | 257/401 |
| 2016/0190158 A1 | 6/2016 | Song |
| 2017/0323871 A1* | 11/2017 | Yeh ...................... G09G 3/3216 |

OTHER PUBLICATIONS

International Search Report and Written Opinion for International Patent Application No. PCT/US2016/055069 dated May 30, 2017, 16 pgs.

\* cited by examiner

MICRO LED DISPLAY MINIATURIZATION MECHANISM

CROSS-REFERENCE TO RELATED APPLICATION

This patent application is a U.S. National Phase Application under 35 U.S.C. § 371 of International Application No. PCT/US2016/055069, filed Oct. 1, 2016, entitled "MICRO LED DISPLAY MINIATURIZATION MECHANISM," which designates the United States of America, the entire disclosure of which is hereby incorporated by reference in its entirety and for all purposes.

FIELD

Embodiments described herein generally relate to computer systems. More particularly, embodiments relate to computer system display devices.

BACKGROUND

Active Matrix Organic Light Emitting Diode (AMOLED) displays have been developed for use in a variety of computing displays and devices, including notebook computers, desktop computers, tablet computing devices, mobile phones (e.g., smart phones) automobile in-cabin displays, watches, televisions, etc. Conventional displays use driver integrated circuits (ICs) to control signal processing from a system on chip (SoC) to the display panel. These driver ICs may be referred to as Timing Controller (TCON), Source Driver ICs. In some instances a TCON may be embedded into a single IC, known as a TCON embedded source driver (TED) IC. TEDs are typically normally connected to a panel through either chip-on-flex (COF), or placed on glass (e.g., chip-on-glass (COG)). Nonetheless, both approaches increase the mechanical footprint of the devices due to tap-bonding, which creates a significant challenge in tight form-factor designs like watches.

DETAILED DESCRIPTION

In the following description, numerous specific details are set forth in order to provide a thorough understanding of various embodiments. However, various embodiments of the invention may be practiced without the specific details. In other instances, well-known methods, procedures, components, and circuits have not been described in detail so as not to obscure the particular embodiments of the invention.

Figure 1:
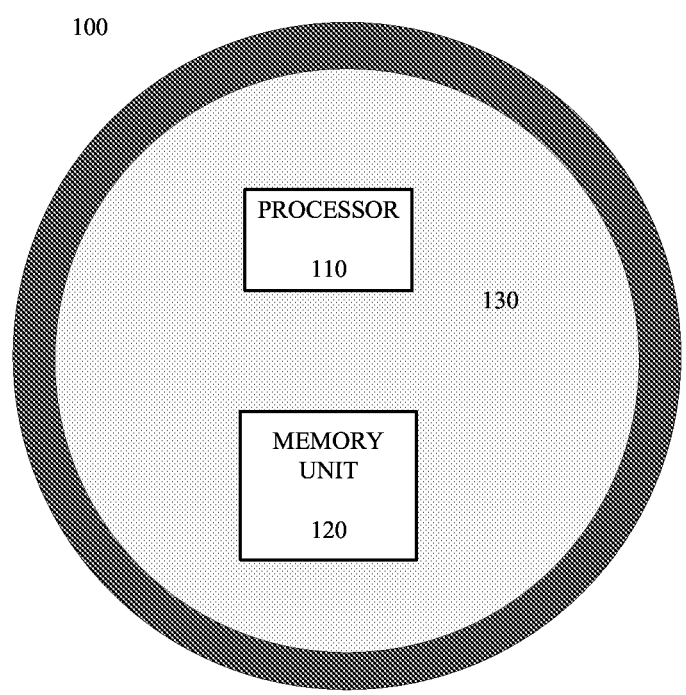
FIG. 1 illustrates one embodiment of a computing system.

FIG. 1 illustrates a block diagram of one embodiment of a mobile device 100. In one embodiment, mobile device 100 comprises a smart watch. However in other embodiments, mobile device 100 may include, but is not limited to, a mobile phone (smart phone), a laptop, a notebook, a hand-held computer, a handheld enclosure, a portable electronic device, a mobile internet device (MID), a table, a slate and/or a personal digital assistant. The embodiments, however, are not limited to this example. As shown in the illustrated embodiment of FIG. 1, mobile device 100 may include a processor 110, a memory unit 120 and a display (or screen) 130.

Processor 110 may be implemented as any processor, such as a complex instruction set computer (CISC) microprocessor, a reduced instruction set computing (RISC) microprocessor, a very long instruction word (VLIW) microprocessor, a processor implementing a combination of instruction sets, or other processor device. In one embodiment, processor 110 may be implemented as a general purpose processor, such as a processor made by Intel® Corporation, Santa Clara, Calif. Processor 110 may be implemented as a dedicated processor, such as a controller, microcontroller, embedded processor, a digital signal processor (DSP), a network processor, a media processor, an input/output (I/O) processor, and so forth. The embodiments are not limited in this context.

Memory unit 120 may include any machine-readable or computer-readable media capable of storing data, including both volatile and non-volatile memory. For example, memory 120 may include read-only memory (ROM), random-access memory (RAM), dynamic RAM (DRAM), Double-Data-Rate DRAM (DDRAM), synchronous DRAM (SDRAM), static RAM (SRAM), programmable ROM (PROM), erasable programmable ROM (EPROM), electrically erasable programmable ROM (EEPROM), flash memory, polymer memory such as ferroelectric polymer memory, ovonic memory, phase change or ferroelectric memory, silicon-oxide-nitride-oxide-silicon (SONOS) memory, magnetic or optical cards, or any other type of media suitable for storing information. It is worthy to note that some portion or all of the memory 120 may be included on the same integrated circuit as the processor 110, or alternatively some portion or all of the memory 120 may be disposed on an integrated circuit or other medium, for example a hard disk drive, that is external to the integrated circuit of the processor 110. In an embodiment, memory 120 may include data and instructions to operate the processor. The embodiments are not limited in this context.

In one embodiment, screen 130 may provide high brightness and/or contrast. For example, the screen may have a 2000:1 contrast. In an embodiment, screen 130 may have a wide aspect ratio, and may be located on the side of the mobile device. In a further embodiment, screen 130 may be located on a front side or the main side of mobile device. In yet another embodiment, screen 130 may extend to the edge of the mobile device 100. For example, mobile device 100 may have no visible physical bezel connecting or joining the screen 130 to the edge of the mobile device 100.

According to embodiment, screen 130 may include a user interface display and/or a touch screen. The user interface display and/or touch screen may include a graphical user interface. In an embodiment, the entire screen 130 may include a user interface display and/or a touch screen. In an embodiment, only a part of the screen 130 may include a user interface display and/or a touch screen. In a further embodiment, the screen 130 with a user interface display may include one or more interactive and/or non-interactive areas. In one embodiment, screen 130 comprises an organic light emitting diode (OLED) display, such an AMOLED display. However in other embodiments an inorganic LED may be implemented.

Figure 2:
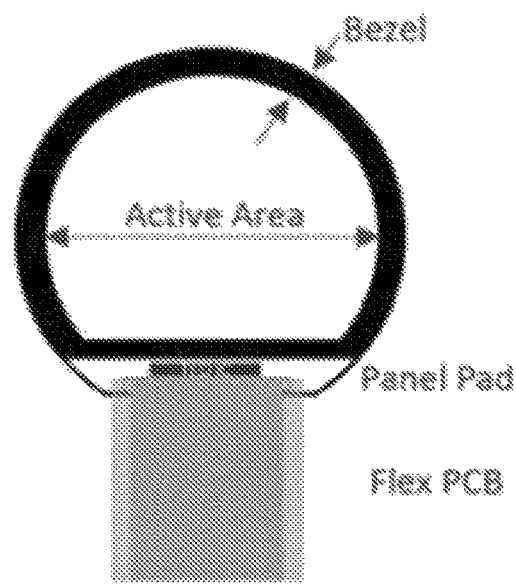
FIG. 2 illustrates a conventional chip on glass system.

FIG. 2 illustrates a smart watch having a conventional chip on glass (COG) system. As shown in FIG. 2, a TED IC is bonded to a display, and coupled to a flexible printed circuit board. As discussed above, this configuration increases the mechanical footprint of the watch. Further, the configuration creates a dead region around the tab bonding area, known as a "flat tire" design. Additionally, the conventional system requires dedicated driver ICs due to data addressing being in several 10's of MHZ, depending upon the resolution of the device. For example, a typical 400×400 resolution watch requires approximately 80 MHz frequency of data operation using a digital driving scheme. Such data rates are not addressed by existing transistor technology printed on glass due to lower mobility.

According to one embodiment, control circuitry (e.g., TED) IC is separated into small sized Complementary metal-oxide-semiconductor (CMOS) ICs (or chiplets) that are mounted on a computer system 100 display, such display 130. In such an embodiment, the chiplets are fabricated on a wafer transferred to the display via a Micro-Transfer Process (MTP), or via a Micro-Pick & Bond (MPB) technology. MPB technology is a process that enables micron scale solid state devices to be picked up from a small wafer and transferred to a substrate (e.g., glass or plastic).

Figure 3:
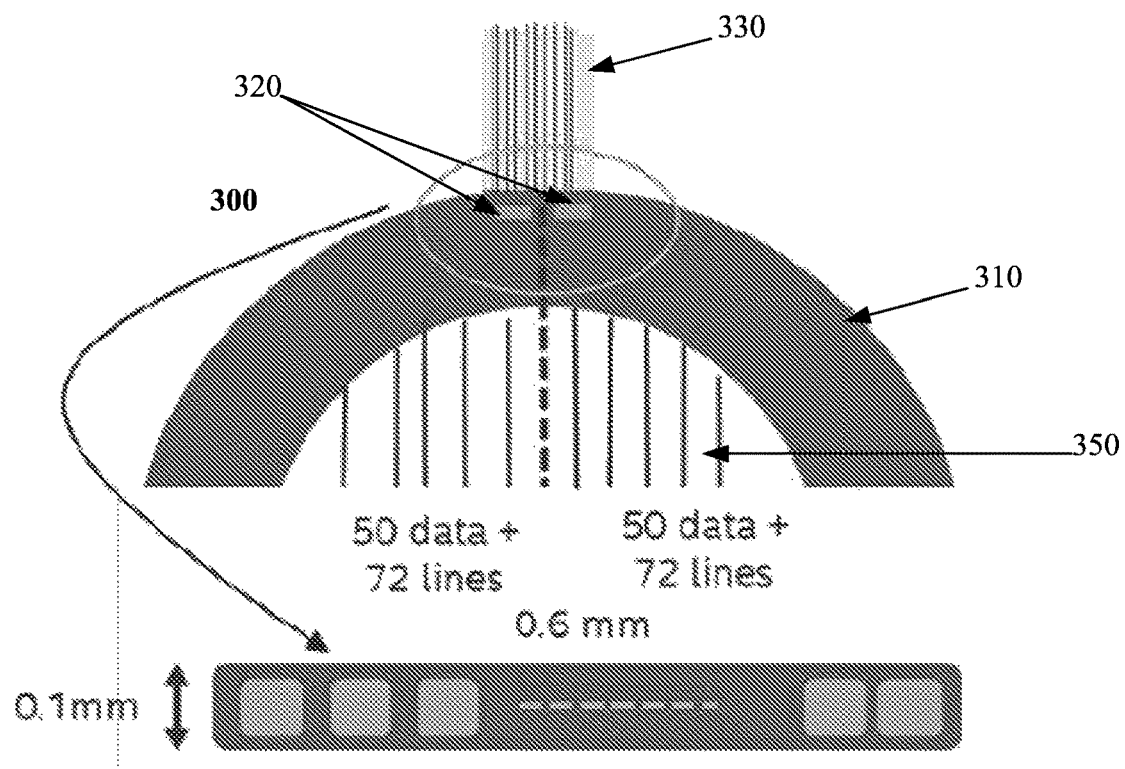
FIG. 3 illustrates one embodiment of chiplets placed on a display.

FIG. 3 illustrates one embodiment of chiplets mounted on a smart watch LED display 300. In one embodiment, chiplets 320 are mounted on the substrate of watch 300. As shown in FIG. 3, chiplets 320 are mounted on a bezel 310 component of watch 300. In a further embodiment, controller or (TCON) circuitry is divided between chiplets 320 in order to optimize spacing and routing. This division enables the chiplets 320 to directly drive a serial interface into the display 300 panel without having to perform the necessary parallelization in the conventional schemes in which the TCON is outside of the display panel. In a further embodiment, the chiplets 320 input to the display 300 panel is reduced from 344 lines to 64 lines, thus significantly reducing the bond pad size of a flexible cable 330 (e.g., from 8.9 mm to 1.3 mm assuming same pad size/pitch design).

Figure 4:
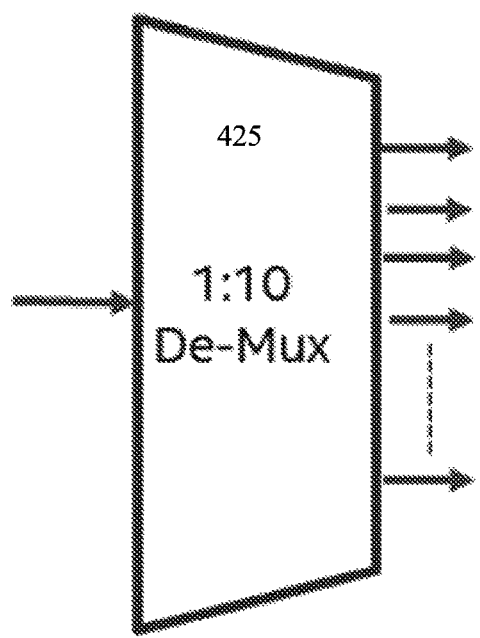
FIG. 4 illustrates one embodiment of a de-multiplexer.
Figure 5:
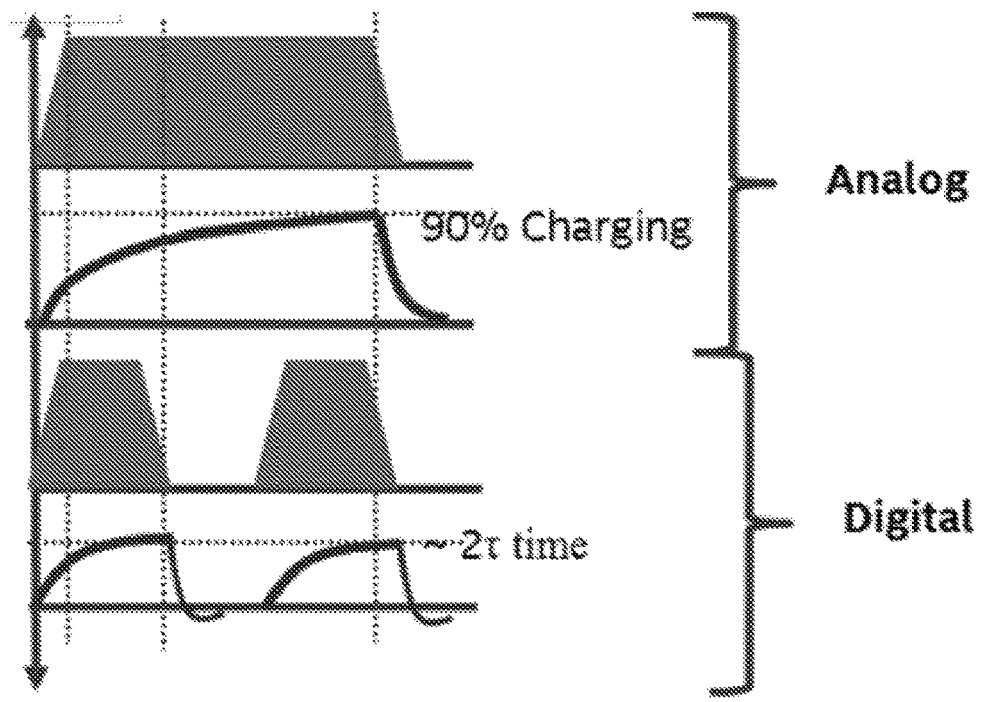
FIG. 5 illustrates one embodiment of digital driving versus analog driving.

According to one embodiment, each chiplet 320 includes digital driver circuitry to perform de-multiplexing operations. FIG. 4 illustrates one embodiment of a de-multiplexer 425 implemented to perform 1:10 de-multiplexing, as opposed to 1:5 de-multiplexing implemented in analog drivers. Further, implementation of digital driving performs for charging above threshold (e.g., 2τ~66%), rather than having to wait for 90% of charging. Such charging allows for the reduction of fan-out signals 350 transmitted to display column drivers (not shown). FIG. 5 illustrates one embodiment of digital driving versus analog driving.

Figure 6:
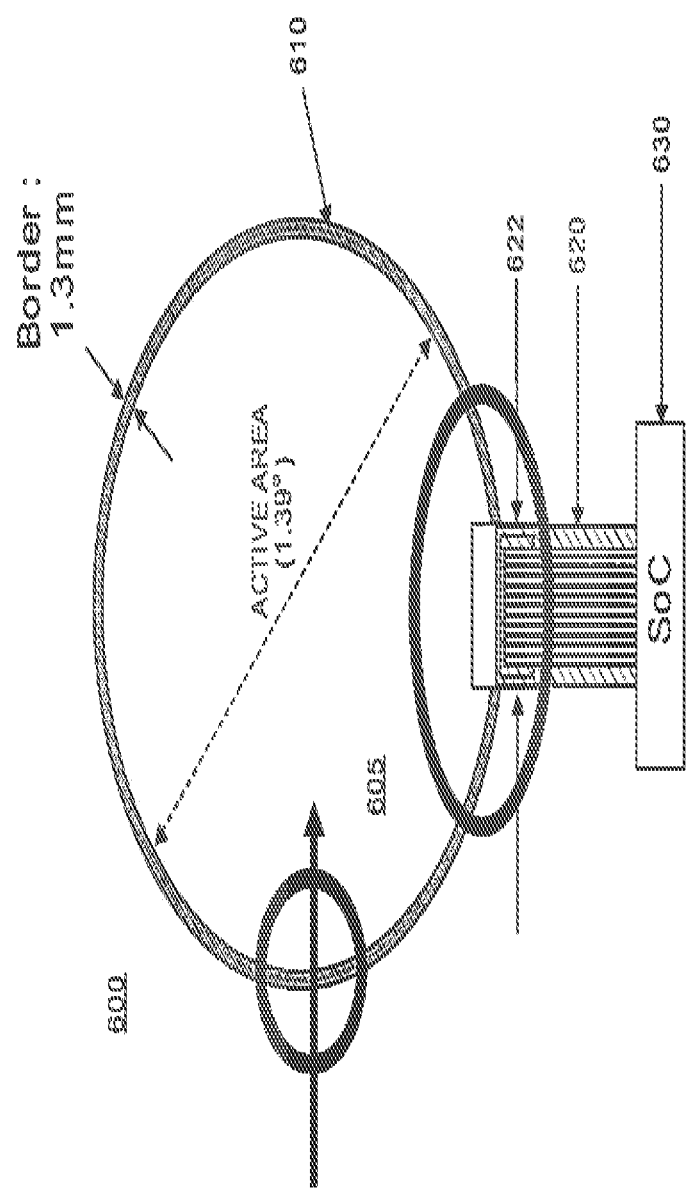
FIG. 6 illustrates one embodiment of a smart watch.

In further embodiments digital driving also allows display 300 to be driven at lower voltages, which reduces the need for voltage rectifiers, charge pumps and other passive components. The elimination of such circuit components enables further reduction in the size of flexible cable 330. FIG. 6 illustrates one embodiment of a system 600 having a display area 605 coupled to a SoC 630 via flexible cable 620. Flexible cable 620 includes a bond pad 622 coupled to display 605 in order to route signals between chiplets 320 and SoC 630. As shown in FIG. 6, the bezel 610 is reduced to 1.3 mm as a result of the fan-out reduction attributed to 1:10 de-multiplexing. The bezel size reduction, in turn, results in a larger active display area 605. Further, the digital driver operation also reduces the size of pad 622 (e.g., from 8.9 mm to 1.3 mm).

References to "one embodiment", "an embodiment", "example embodiment", "various embodiments", etc., indicate that the embodiment(s) so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The following clauses and/or examples pertain to further embodiments or examples. Specifics in the examples may be used anywhere in one or more embodiments. The various features of the different embodiments or examples may be variously combined with some features included and others excluded to suit a variety of different applications. Examples may include subject matter such as a method, means for performing acts of the method, at least one machine-readable medium including instructions that, when performed by a machine cause the machine to performs acts of the method, or of an apparatus or system for facilitating hybrid communication according to embodiments and examples described herein.

Some embodiments pertain to Example 1 that includes a mobile computing device comprising a Light Emitting Diode (LED) display, including a display panel and a substrate, and two or more controller integrated circuits mounted (ICs) mounted on the substrate to directly drive a serial interface into the display panel.

Example 2 includes the subject matter of Example 1, wherein each of the ICs comprise digital driver circuitry to perform de-multiplexing operations.

Example 3 includes the subject matter of Examples 1 and 2, wherein the digital driver circuitry performs charging above threshold.

Example 4 includes the subject matter of Examples 1-3, further comprising a system on chip (SoC) and a flexible cable coupled between the LED display and the SoC to transfer signals between the SoC and the ICs.

Example 5 includes the subject matter of Examples 1-3, wherein the flexible cable comprises a bond pad coupled to the ICs.

Example 6 includes the subject matter of Examples 1-3, wherein the ICs are mounted to the substrate via a Micro-Pick & Bond (MPB) process.

Example 7 includes the subject matter of Examples 1-3, wherein the ICs are mounted to the substrate via a Micro-Transfer Process (MTP).

Example 8 includes the subject matter of Examples 1-3, wherein the LED display comprises a smart watch display.

Example 9 includes the subject matter of Examples 1-3, wherein the display panel comprises a bezel component, and wherein the ICs are mounted on the bezel component.

Some embodiments pertain to Example 10 that includes a Light Emitting Diode (LED) display comprising a display panel, a substrate and two or more controller integrated circuits mounted (ICs) mounted on the substrate to directly drive a serial interface into the display panel.

Example 11 includes the subject matter of Example 10, wherein each of the ICs comprise digital driver circuitry to perform de-multiplexing operations.

Example 12 includes the subject matter of Examples 10 and 11, wherein the digital driver circuitry performs charging above threshold.

Example 13 includes the subject matter of Examples 10-12, wherein the display panel is coupled to a flexible cable to transfer signals between the ICs and a system on chip (SoC).

Example 14 includes the subject matter of Examples 10-13, wherein the ICs are mounted to the substrate via a Micro-Pick & Bond (MPB) process.

Example 15 includes the subject matter of Examples 10-14, wherein the ICs are mounted to the substrate via a Micro-Transfer Process (MTP).

Example 16 includes the subject matter of Examples 1-15, wherein the display panel comprises a bezel component, and wherein the ICs are mounted on the bezel component.

Some embodiments pertain to Example 17 that includes a smart watch comprising a Light Emitting Diode (LED) display; including a display area and a bezel and two or more controller integrated circuits mounted (ICs) mounted on the bezel to directly drive a serial interface into the display area.

Example 18 includes the subject matter of Example 17, wherein each of the ICs comprise digital driver circuitry to perform de-multiplexing operations.

Example 19 includes the subject matter of Examples 17 and 18, further comprising a system on chip (SoC) and a flexible cable coupled between the LED display and the SoC to transfer signals between the SoC and the ICs.

Example 20 includes the subject matter of Examples 17-19, wherein the ICs are mounted to the bezel via a Micro-Pick & Bond (MPB) process.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions in any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

What is claimed is:

1. A mobile computing device comprising:
    a Light Emitting Diode (LED) display, including:
        a display panel;
        a bezel component, the bezel component comprising a curved portion;
        two or more controller integrated circuits (ICs) mounted on the curved portion of the bezel component, the two or more controller ICs to directly drive a serial interface into the display panel; and
        a memory unit mounted on the bezel component, the memory unit separate and distinct from the two or more controller ICs.

2. The mobile computing device of claim 1, wherein each of the ICs comprise digital driver circuitry to perform de-multiplexing operations.

3. The mobile computing device of claim 2, wherein the digital driver circuitry performs charging above threshold.

4. The mobile computing device of claim 1, further comprising:
    a system on chip (SoC); and
    a flexible cable coupled between the LED display and the SoC to transfer signals between the SoC and the ICs.

5. The mobile computing device of claim 4, wherein the flexible cable comprises a bond pad coupled to the ICs.

6. The mobile computing device of claim 1, wherein the ICs are mounted to the bezel component via a Micro-Pick & Bond (MPB) process.

7. The mobile computing device of claim 1, wherein the ICs are mounted to the bezel component via a Micro-Transfer Process (MTP).

8. The mobile computing device of claim 7, wherein the LED display comprises a smart watch display.

9. Light Emitting Diode (LED) display comprising:
    a display panel;
    a bezel component, the bezel component comprising a curved portion;
    two or more controller integrated circuits mounted (ICs) mounted on the curved portion of the bezel component, the two or more controller ICs to directly drive a serial interface into the display panel; and
    a memory unit mounted on the bezel component, the memory unit separate and distinct from the two or more controller ICs.

10. The LED display of claim 9, wherein each of the ICs comprise digital driver circuitry to perform de-multiplexing operations.

11. The LED display of claim 10, wherein the digital driver circuitry performs charging above threshold.

12. The LED display of claim 11, wherein the display panel is coupled to a flexible cable to transfer signals between the ICs and a system on chip (SoC).

13. The LED display of claim 9, wherein the ICs are mounted on the bezel component via a Micro-Pick & Bond (MPB) process.

14. The LED display of claim 9, wherein the ICs are mounted on the bezel component via a Micro-Transfer Process (MTP).

15. A smart watch comprising:
    a Light Emitting Diode (LED) display, including:
        a display area;
        a bezel, the bezel comprising a curved portion;
        two or more controller integrated circuits mounted (ICs) mounted on the curved portion of the bezel, the two or more controller ICs to directly drive a serial interface into the display area; and
        a memory unit mounted on the bezel, the memory unit separate and distinct from the two or more controller ICs.

16. The smart watch of claim 15, wherein each of the ICs comprise digital driver circuitry to perform de-multiplexing operations.

17. The smart watch of claim 16, further comprising:
    a system on chip (SoC); and
    a flexible cable coupled between the LED display and the SoC to transfer signals between the SoC and the ICs.

18. The smart watch of claim 15, wherein the ICs are mounted on the bezel via a Micro-Pick & Bond (MPB) process.

* * * * *